United States Patent
Li et al.

(10) Patent No.: US 6,258,721 B1
(45) Date of Patent: Jul. 10, 2001

(54) DIAMOND SLURRY FOR CHEMICAL-MECHANICAL PLANARIZATION OF SEMICONDUCTOR WAFERS

(75) Inventors: Yuzhuo Li, Potsdam, NY (US); David Bruce Cerutti, Powell, OH (US); Donald Joseph Buckley, Jr., Schenectady, NY (US); Earl Royce Tyre, Jr., Dallas, GA (US); Jason J. Keleher, Schenectady; Richard J. Uriarte, Clifton Park, both of NY (US); Ferenc Horkay, Rockville, MD (US)

(73) Assignee: General Electric Company, Pittsfield, MA (US)

( * ) Notice: Subject to any disclaimer, the term of this patent is extended or adjusted under 35 U.S.C. 154(b) by 0 days.

(21) Appl. No.: 09/472,104

(22) Filed: Dec. 27, 1999

(51) Int. Cl.$^7$ .................. H01L 21/302; H01L 21/461
(52) U.S. Cl. .................. 438/693; 438/692; 438/691; 216/89; 106/3; 252/79.1; 451/36
(58) Field of Search .................. 438/693, 692, 438/691, 690; 216/89, 38; 106/3; 252/79.1, 79.2, 79.5; 51/308, 306, 307; 451/36

(56) References Cited

U.S. PATENT DOCUMENTS 6,054,183 * 4/2000 Zimmer et al. .................. 427/249.8

* cited by examiner

Primary Examiner—Charles Bowers
Assistant Examiner—Hsien-Ming Lee
(74) Attorney, Agent, or Firm—Mueller and Smith, LPA

(57) ABSTRACT

The multistage process for the chemical-mechanical planarization (CMP) of Cu commences with forming a primary aqueous or non-aqueous (e.g., using alcohols and ketones as non-aqueous carriers) slurry from (i) between about 0 and 7 wt-% of an oxidizer, (ii) between 0 and 7 wt-% of a chelating agent, (iii) between about 0 and 5 wt-% of a surfactant, (iv) between about 0.001 and 5 wt-% diamond particles having an average particle size not substantially above about 0.4 $\mu$, and (v) an amount of a pH adjustment agent so that the aqueous slurry has a pH of between about 3 and 10, and advantageously about 5). The Cu of the semiconductor wafer then is subjected to CMP using the primary aqueous slurry and then is subjected to a cleaning operation. Next, a secondary aqueous slurry from (i) between about 0 and 5 wt-% of an hydroxyl amine compound, (ii) between about 0 and 7 wt-% of a chelating agent, (iii) between about 0 and 5 wt-% of a surfactant, (iv) between about 0.001 and 5 wt-% diamond particles having an average particle size not substantially above about 0.4 $\mu$, and (v) an amount of a pH adjustment agent so that the aqueous slurry has a pH of between about 4 and 10, and advantageously about 8.5 pH. The semiconductor wafer then is subjected to CMP using said secondary aqueous slurry. Thereafter, the semiconductor wafer again is subjected to a cleaning operation.

18 Claims, No Drawings

DIAMOND SLURRY FOR CHEMICAL-MECHANICAL PLANARIZATION OF SEMICONDUCTOR WAFERS

CROSS-REFERENCE TO RELATED APPLICATIONS

None

STATEMENT REGARDING FEDERALLY SPONSORED RESEARCH

Not applicable.

BACKGROUND OF THE INVENTION

The present invention relates generally to the preparation of semiconductor devices and more particularly to improved slurry compositions for the chemical-mechanical planarization (CMP) of metal (e.g., Cu) layers and barrier materials (e.g., Ta, TaN, etc.) and dielectric materials for their polishing.

A semiconductor wafer typically includes a substrate, such as a silicon wafer, on which a plurality of integrated circuits have been formed. In the manufacture of integrated circuits, wafer surface planarity and quality is of extreme importance. In order to achieve the degree of planarity required to produce ultra high density integrated circuits, CMP processes are being employed.

In general, CMP involves pressing a semiconductor wafer against a moving polishing surface that is wetted with a chemically reactive, abrasive slurry. Conventional slurries either are acidic or basic, and generally contain alumina, silica, zirconium oxide, magnesium oxide, or cerium oxide abrasive particles. The polishing surface usually is a planar pad made of a relative soft, porous material, such as polyurethane. The pad usually is mounted on a planar platen. Continuous pad devises also are being tested. Systems devoid of a slurry where the pad contains the abrasive also are being used.

Integrated circuits are chemically and physically integrated into a substrate by patterning regions in the substrate and layers on the substrate. The layers generally are formed of various materials having either a conductive, insulating, or semiconducting nature. Also, barrier materials or barriers are used to prevent the migration of ions and adhesion promoters. In order for a device to have high yields, it is crucial to start with a flat semiconductor wafer. If the surface is not uniform (e.g., areas of unequal elevation or surface imperfections), various problems can occur which may result in a large number of inoperable devices. Further in this regard can be found in the following references: Luo, et al., "Chemical-Mechanical Polishing of Copper: A Comparative Analysis," February 13–14 *CMP-MIC Conference*, 1997 ISMIC—200:197/0083; Babu, et al., "Some Fundamental and Technological Aspects of Chemical-Mechanical Polishing of Copper Films: A Brief Review," February 19–20, 1998 *CMP-MIC Conference*, 1998 IMIC—300P98/0385; Tseng, et al., "Effects of mechanical characteristics on the chemical-mechanical polishing of dielectric thin films," *Thin Solid Films*, 290–291 (1996) 458–463; Nanz, et al., "Modeling of Chemical-Mechanical Polishing: A Review," *IEEE Transactions on Semiconductor Manufacturing*, Vol. 8, No. 4, November 1995; Stiegerwald, et al., "Pattern Geometry Effects in the Chemical-Mechanical Polishing of Inlaid Copper Structures,": "*J. Electrom. Soc.*, Vol 141, No. Oct. 10, 1994; Fury, "Emerging developments in CMP for semiconductor planarization—Part 2," *Solid State Technology*, 81–88, July 1995; Fury, "CMP Standards: A Frustration Cure," *Semiconductor International*, November 1995.

A related, but different, operation performed on magnetic disks is called "texturing." Texturing is used to reduce stiction (static friction). More irregular surfaces have lower stiction and this leads to the practice of texturing disk surfaces using fixed or free abrasive particles. Texturing operations are known in the art to utilize typically <0.4 $\mu$ diamond at a concentration of less than 2 carats/liter in order to achieve approximately 7A Ra by AFM. Alumina also is a common abrasive used in texturing operations. See for following references in this regard: Cooper, et al., "Tapes for Polishing and Texturing Thin-Film Magnetic Disks," Technical Information Report presented at Discon USA '96, Texwipe Company LLC; and Bhushan, "Magnetic Slider/Rigid Disk Substrate Materials and Disk Texturing Techniques—Status and Future Outlook," *Adv. Info. Storage Syst.*, Vol. 5,1993: 175–209.

Despite CMP being commercially practice, there still are a number of problems including, for example, non-uniformity in material removal rate, Cu dishing, oxide erosion, Cu line corrosion, and other surface defects. Thus, there exists a need in CMP for improvements.

BRIEF SUMMARY OF THE INVENTION

Broadly, chemical-mechanical planarization (CMP) of the Cu of semiconductor wafers is practiced using polycrystalline diamond particles. Desirably, between about 0.001 and 5 wt-% diamond particles having an average particle size not substantially above about 0.4$\mu$ is employed. Desirably, conventional chemicals as are used in conventional CMP are included. Either a one-stage or a multistage process can be used.

The multistage process for the chemical-mechanical planarization (CMP) of Cu commences with forming a primary aqueous or non-aqueous (e.g., using alcohols and ketones as non-aqueous carriers) slurry from (i) between about 0 and 7 wt-% of an oxidizer, (ii) between 0 and 7 wt-% of a chelating agent, (iii) between about 0 and 5 wt-% of a surfactant, (iv) between about 0.001 and 5 wt-% diamond particles having an average particle size not substantially above about 0.4$\mu$, and (v) an amount of a pH adjustment agent so that the aqueous slurry has a pH of between about 3 and 10, and advantageously about 5). The Cu of the semiconductor wafer then is subjected to CMP using the primary aqueous slurry and then is subjected to a cleaning operation. Next, a secondary aqueous slurry from (i) between about 0 and 5 wt-% of an a hydroxyl amine compound, (ii) between about 0 and 7 wt-% of a chelating agent, (iii) between about 0 and 5 wt-% of a surfactant, (iv) between about 0.001 and 5 wt-% diamond particles having an average particle size not substantially above about 0.4$\mu$, and (v) an amount of a pH adjustment agent so that the aqueous slurry has a pH of between about 4 and 10, and advantageously about 8.5 pH. The semiconductor wafer then is subjected to CMP using said secondary aqueous slurry. Thereafter, the semiconductor wafer again is subjected to a cleaning operation.

DETAILED DESCRIPTION OF THE INVENTION

Surface planarity is of paramount importance in microelectronics. With the integrated technology approaching the era of Ultra Large Scale Integration (ULSI), CMP is touted as the only viable technique to meet today's planarity requirements. Some of the most important issues in CMP today addressed to dishing and erosion, corrosion, defects of the surface, include the control of polishing rate and selectivity among different materials on the surface. To accomplish these goals, a polishing particles with desired hardness and functionality is the most promising solution. Because of its hardness (i.e., expected scratching due to its hardness), diamond has heretofore not been viewed as a promising candidate for use in CMP operations. Particle shape and use of polycrystalline diamond appear to allay scratching concerns; however, polycrystalline diamond also is 5–10 times more expensive than typical monocrystalline diamond. Cost, then, is the second major concern that has steered the art clear of using diamond in CMP operations. Cost has been mitigated by using very low amounts of polycrystalline diamond, i.e., about 0.01 wt-%-0.1wt-% (0.5 cts/liter–5 cts/liter). The present invention, however, utilizes the hardness of diamond in CMP to advantage which heretofore has alluded the art.

In the desirable two stage Cu CMP operation disclosed herein (while the invention was initially developed for Cu CMP, likely it will be applicable to other CMP operations), the use of the primary diamond slurry in the primary or first stage enables better selectivity for removal of copper relative to Ta than is seen using conventional alumina or silica slurries. When subjecting the semiconductor wafer to post stage one cleaning operations, fewer diamond particles are residual on the wafer than is seen using conventional alumina slurries. Less residual abrasive particles post-cleaning is expected to translate into less wafer defects. Another key advantage of the invention resides in the expected lower disposal costs of low concentration diamond slurries. At the very low concentrations of polycrystalline diamond employed, there is little diamond consumed by the CMP operation and keeping such low concentration of diamond dispersed is a simpler operation. Moreover, such small concentration of diamond further translated is less expected clogging of the feeding mechanisms.

Following the second stage CMP with the secondary diamond slurry, erosion (removal of the wafer substrate) also is somewhat less than when using conventional silica slurries. In second stage CMP the secondary diamond slurry also translates into greater Ta/oxide selectivity, i.e., maximum Ta polishing rate with minimum oxide polishing rate than is seen with conventional silica slurries.

Concomitant with such improvements in CMP operations, the inventive 2-stage slurry in this process maintains good material removal rates (MRR) of Cu in the first stage, low scratch density in the second stage, and a low level of corrosion compared to conventional polishing slurries (typified by alumina and silica slurries). In this regard, it is advantageous that the 2-stage process uses the same abrasive grit in both stages.

Such achievements are attained by using a different slurry in each of two CMP stages. Referring initially to the first stage, its composition is as follows (adjust ranges per changes before):

(ii) between about 0 and 7 wt-% of a chelating agent,
(iii) between about 0 and 5 wt-% of a surfactant,
(iv) between about 0.001 and 5 wt-% diamond particles having an average particle size not substantially above about 0.4µ, and
(v) an amount of a pH adjustment agent so that the aqueous slurry has a pH of between about 3 and 10.

Suitable chelating agents include, for example, diamines, triamines, alkyl or aryl dicarboxylic acids, and amino acids. Suitable oxidizers include, for example, alkyl hydroperoxides, periodates, and persulfates. Suitable surfactants include, for example, alkylated polyethylene oxide, alkylated cellulose, alkylated polyvinyl alcohols, and alkyl and/or aryl carboxylic acid, sulfate, and ammonium salts.

With respect to the diamond particles, it is preferred to use shock polycrystalline diamond of an average particle size of less than about 0.4µ, although particles sizes of between about 0.1 and 0.2µ can be used to advantage in both CMP polishing stages. The amount of polycrystalline diamond particles broadly ranges from about 0.001 about 5 wt-%, with amounts of less than about 0.1 wt-% being quite useful in both stages.

The preferred polycrystalline diamond used advantageously is "precisely graded" or micronized using Stokes Law. Also, the diamond particles are produced to have a morphology of very rounded particles (no sharp edges) because it is believed that the sharp edges produce scratches and defects. The polycrystalline diamond, because it is made up of many small (100 A) crystallites, will become round on milling whereas the typical monocrystalline material will likely fracture along a cleavage plane—making new sharp corners. Also, the polycrystalline diamond is subjected to a cleaning process that makes very clean diamond. Polycrystalline diamond also has a very low metal content, is chemically inert (i.e., it does not catalyze decomposition of hydrogen peroxide), and is physically inert (i.e., it does not hold small metal particles).

Suitable pH adjustment agents include acids typified by mineral acids (e.g., HCl, $H_2SO_4$, $HNO_3$, HI) and organic acids (e.g., formic acid, acetic acid, propanoic acid, and oxalic acid). The type of acid has not been demonstrated to adversely impact the CMP operation. Suitable pH adjustment agents also include bases typified by alkali and alkaline earth metal hydroxides and oxides (e.g., NaOH, NaO, ammonia, and organic amines). The choice of acid or base adjustment agent will depend upon the pH of the slurry sans agent, with the final pH dictated by factors well known to those skilled in this art. The preferred pH of the primary stage is about 5 and for the secondary stage it is about 8.5.

The balance of the primary slurry is purified DI (deionized) water with sufficient of it added to yield a final diamond particles solids content of less than 5 wt-%. An advantageous amount of diamond particles in the primary slurry is between about 0.005 and 0.1 wt-%.

With respect to the secondary slurry, all of the foregoing ingredients and amounts are the same, except that the oxidizer and chelating agent are replaced with hydroxyl amine, i.e., (i) between about 0 and 5 wt-% of hydroxyl amine,
(ii) between about 0 and 7 wt-% of a chelating agent,
(iii) between about 0 and 5 wt-% of a surfactant,
(iv) between about 0.001 and 5 wt-% diamond particles having an average particle size not substantially above about 0.4µ, and
(v) an amount of a pH adjustment agent so that the aqueous slurry has a pH of between about 4 and 10;

The chemical polishing composition of the present invention may be prepared simply by mixing and stirring water with the above-mentioned mono- or poly-crystalline diamond particles. Ultrasonic dispersal can be practiced optionally. There is no particular restriction as to the order of mixing these materials except that the addition of an oxidizer is preferred to be the last step.

A composition consisting solely of water and diamond particles can be used as a polishing agent; however, in order to further improve the polishing performance, the other ingredients described above preferably are incorporated into such polishing composition.

CMP planarization and cleaning operations are practiced in conventional fashion, such as can be found in the literature. In this regard, the following references are representative: "CMP Grows in Sophistication", *Semiconductor International*, November 1998 Cover Story, Ruth Dejule, Associate Editor; Sethuraman, "CMP—Past, Present and Future", *Future Fab*, Issue 5 (3/10/1999); and "Slurries and Pads Face 2001 Challenges", *Semiconductor International*, Alexander E. Braun, Associate Editor, November 1998. Passivating agents may be added into the first and second stage slurries to reduce copper corrosion or dishing. In general, all benzotriazole or benzothiazole compounds can be used as copper film passivating agents. Some representative examples include but not limited to 1 H-benzotriazole-acetonitrile, benzotriazole-5-carboxylic acid, 2(3H)-benzothiazolone, and 1 H-Benzotriazole-1-methanol.

Using the preferred two-stage process described herein and based upon data collected using such process, the following tables depict the CMP performance that is believed to be attainable by judicious practice of the present invention.

TABLE A

| 1st Stage | MRR (Cu) | Selectivity (Cu/Ta) | Ra | Scratch | Uniformity |
|---|---|---|---|---|---|
| Goal | 500 nm/min | >100:1 | 2 nm | Qualitative | <5% |
| 3% Alumina | 500 (50) | 50 (15) | 3 (1) | Control | 5 (1) |
| 0.01% PCD | 300 (30) | 150 (45) | 6 (2) | equal | 4 (1) |

TABLE B

| 2nd Stage | Ra | Scratch | Erosion | Dishing | Corrosion | Select. (Cu/Ta) |
|---|---|---|---|---|---|---|
| Goal | 2 | Qualitative | <7% (~<500A) | <7% (<300A) | Qualitative | 1:1 |
| 3% Silica | 3 (1) | Control | 500 (50) | 360 (30) | Control | 2 (1) |
| 0.01% PCD | 3 (1) | Equals Control | 300 (30) | 500 (50) | = Control | 2 (1) |

| 2nd Stage | MRR (Cu) | MRR (Ta) | MRR ($SiO_2$) | Post Clean (2nd Stage) | Metal Res. (2nd Stage) |
|---|---|---|---|---|---|
| Goal | 30–50 | 30– | 0 | <1000 part/wafer | $10^9$ atom/wafer |
| 3% Silica | 120 (30) | 60 (5) | 5 | 2000 (200) | TBD |
| 0.01% PCD | 60 (30) | 30 (5) | ~0 | 1000 (100) | TBD |

The following examples show how the present invention should be practiced, but should not be construed as limiting. In this application, all percentages and amounts are by weight and all units are in the metric system, unless otherwise noted.

EXAMPLES

In the Examples, all deionized water used had a quality of >18 mega ohms. Also, the diamond reported in the Examples is monocrystalline diamond which was found acceptable for most CMP performance criteria except for scratching of the Cu. Thus, polycrystalline diamond was substituted for monocrystalline diamond. Since polycrystalline diamond was found to be equivalent in performance to monocrystalline diamond except that scratching was markedly reduced, most of the tests were not repeated. The results reported below for monocrystalline diamond are believed to be valid for polycrystalline diamond also. For consistency of results, only the monocrystalline diamond results are reported, however.

EXAMPLE 1

An aqueous surfactant solution was prepared by adding Arlasolve 200L surfactant (manufactured by ICI Industries, 80% polyoxyethylene (20), isohexadecyl ether, 20% water, CAS # 69364-63-2, supplied by Emulsion Engineering Inc, Sanford, Fla.) to deionized water in a vessel fitted with a magnetic stirring system. Agitation was continued for 10 minutes or until no surfactant was visible in the solution. Thereafter, the solution was subjected to sonication for about 25 minutes.

Monocrystalline diamond was prepared and graded to obtain micronized diamond particles having an average particle size of 0.15 micron with a maximum particle of 1 micron. This diamond was dispersed in deionized water containing various amount of Arlasolve 200L surfactant with the assistance of sonication to obtain a slurry having a concentration ranging from about 0.001% to 1% by weight. The slurry container was placed on a magnetic stirrer plate and stirred for 10 minutes at 75% maximum speed. Sonication was applied for an additional 25 minutes. The slurry container then was placed back on the magnetic stirrer and stirred at 75% maximum speed for 2 minutes. Various amount of other useful ingredients, such as glycine and hydrogen peroxide, were added into the slurry during stirrinanally, the pH of the slurry was adjust using dilute KOH to achieve a pH=5–6. The slurries compounded had the following composition: 1 wt-% hydrogen peroxide, 1 wt-% glycine, varying amount of diamond or alumina (aluminum oxide, 99% purity, CAS # 1344-28-1), 0.1 wt-% surfactant, and DI water.

Polishing Test

The object to be polished was a 1 "(24 mm) diameter by 0.25 " thick copper (99.99% pure) disk. The disk was mounted on a single side polishing machine (Struers Labopol 5 Grinding Table, Serial # 5200825 and Struers LaboForce 3 Force Arm, Serial #5210461, manufactured by Struers Inc, Westlake, Ohio) having a soft polyurethane polishing pad mounted on the lower side of the polishing machine. Polishing was conducted for three minutes under a pressure of 6 psi by supplying the above mentioned slurry at 60 mL/minute between the disk and the pad. The disk and the pad have a relative rotating speed of 150 rpm. After polishing, the disk was removed from the polisher and ultrasonic cleaning was performed to clean the polished surface of the disk. The weight loss of the disk was measured and the average polishing rate was calculated. The test results are shown in Table 1 below.

TABLE 1

| Experiment | Abrasive Content | Diamond MRR (nm/min) | Alumina (3.3 Bulk Density) MRR (nm/min) |
|---|---|---|---|
| 1 | 0 | 350 | 350 |
| 2 | 0.01% | 640 | 380 |
| 3 | 0.05% | 700 | 521 |
| 4 | 0.1% | 856 | 550 |
| 5 | 0.5% | 1020 | 600 |
| 6 | 1% | 1236 | 750 |
| 7 | 3% | NA | 880 |

As shown in Table 1, monocrystalline diamond yielded an acceptable material removal rate at a much lower concentration of diamond particles comparing to a state of art slurry prepared with alumina particles. This is due the intrinsic hardness of diamond particles.

EXAMPLE 2

A matrix of slurries was prepared according to the procedure described in Example 1 with various concentrations of hydrogen peroxide. The slurry compositions were: varying amounts of hydrogen peroxide, 1 wt-% glycine, 1 wt-% diamond or 3 wt-% alumina, 0.1 wt-% surfactant (see Example 1), and DI water. The polishing tests were conducted using the same protocol as described in Example 1. The material removal rates recorded are listed in Table 2 below.

TABLE 2

MRR vs. Hydrogen Peroxide Concentration

| Experiment | Hydrogen Peroxide % | Diamond MRR (nm/min) | Alumina (3.3 Bulk Density) MRR (nm/min) |
|---|---|---|---|
| 1 | 0 | 30 | 30 |
| 2 | 1 | 1236 | 500 |
| 3 | 3 | 701 | 700 |
| 4 | 5 | 856 | 900 |

As shown in Table 2, a maximum material removal rate was reached at a much lower hydrogen peroxide concentration. Such results again are due the extreme hardness of diamond particles compared to other conventional abrasive particles as typified by alumina in this example. It is believed that harder particle places a lower demand on the formation of thicker oxide/hydroxide film on the surface to be polished.

EXAMPLE 3

A slurry containing 0.1 wt-% monocrystalline diamond, 0.1 wt-% surfactant (Arlasolve 200L), 1 wt-% hydrogen peroxide, and 1 wt-% glycine, was prepared using a similar procedure described in Example 1. The test substrate consisted of a 6" diameter silicon wafer on which a 300 nm of thermal oxide layer, 30 nm of Ta adhesion layer, and 1600 nm of PVD copper were placed. The substrate was mounted onto a Strasbaugh 6A polisher and the slurry was supplied to between the wafer and the pad (Suba 500, Rodel) at the rate of 120 mL/min. The polishing was conducted at 6psi and 120 rpm. After the polishing was completed, the wafer was cleaned and measured for weight loss from which material removal rate was calculated. Similarly, the polishing also was conducted on wafers containing only the thermal oxide layer on the silicon substrate. In addition, wafers containing thermal oxide and Ta layers were also used in this set of polishing tests. Tests also were conducted using conventional alumina (see Example 1) and silica (Cabot L-90 amorphous fumed silica, CAS # 1344-28-1, Cabot Industries, Tuscola, Ill.). The results recorded are displayed in Table 3 below.

TABLE 3

MRR of Cu, Ta, and Oxide

| Abrasive | Cu MRR | Ta MRR | Oxide MRR |
|---|---|---|---|
| Diamond | 900 | 5 | 0 |
| Alumina | 600 | 30 | 30 |
| Silica | 500 | 50 | 50 |

As shown in Table 3, the MRR selectivity of diamond is significantly higher than that of conventional alumina and silica slurries. This is believed to be due at least in part to the hydrophobic nature of the diamond particles which leads to a weaker interaction between the abrasive particles and Ta or oxide surface. This high selectivity translates to advantage in reducing Ta loss in the first stage polishing and oxide loss in the second stage polishing.

EXAMPLE 4

Two slurries were prepared for use in polishing of 8" diameter blanket and patterned wafers. The blanket wafers have the same material stacks as described in Example 3 for copper, Ta, and oxide wafers. The patterned wafers were constructed according to MIT testing floor plan and constructed by Sematech and known as Sematech 926 standard testing wafers for copper CMP slurry evaluation ("MIT/SEMATECH 931 AZ Cu CMP Characterization Test Chip," Technology Transfer # 98103580A-TR, Sematech, Nov. 15, 1998). The first slurry was prepared using a similar procedure described in Example 1. The second slurry contained no hydrogen peroxide and no glycine. Instead, 1 wt-% of hydroxylamine (hydroxylamine hydrogen chloride, 99% purity, ACS reagent, CAS # 5470-11-1) was added to enhance the material removal rate of tantalum. The polishing was conducted on a Westech 472 rotational polisher (SpeedFam-IPEC, Chandler, Ariz.). The following tests were performed:

1. Copper Blanket wafer MRR and WIWNU results
2. Ta and Oxide wafer MRR results
3. Copper line dishing results at 50% pattern density 50 $\mu$m copper line
4. Oxide erosion results at 50% pattern density 0.5 $\mu$m copper line The results recorded are displayed in Table 4 below.

TABLE 4

| Abrasive | WIWNU | Dishing | Erosion | Corrosion |
|---|---|---|---|---|
| Diamond 1 | 3.8% | 1200 A | 300 A | None |
| Silica | 4.5% | 700 A | 500 A | None |

As shown in Table 4, copper material removal rate can be easily controlled via changing the table speed and pressure. Acceptable MRR can be obtained with desirable pressure and table speed comparing to a typical known slurry using, for example, silica abrasive. The "within wafer non-uniformity" (WIWNU) is seen to be excellent compared to the prior art silica slurry.

As also shown in Table 4, the high material removal selectivity for the first stage slurry is retained for the 8"

wafers. The copper line dishing measured at 50% pattern density and 50 μm line region shows result comparable to state of art slurries prepared with other abrasives. The oxide erosion measured at 50% pattern density and 0.5 μm copper line indicates that diamond slurry provides much better results than that obtained from other comparison slurries. It is well know to those skilled in the art that copper line dishing usually is more severe with a wider copper line and oxide erosion is usually more severe with a narrower copper line ("VLSI Multilevel Interconnection Tutorial," *Metal CMP Processes*, by Kistler of Lam Research, Santa Clara, Calif., Sep. 6, 1999, pp. 9–66).

EXAMPLE 5

Three slurries were prepared based upon the following abrasives: 3% alumina, 3% silica and 0.01% diamond. A 5" diameter thermal oxide wafer was placed in each slurry for a period of 5 minutes and subjected to a simple DI water rinse. The wafers then were dried and subjected to examination for particle counts. Initially, without mega sonic cleaning (mega sonic cleaning system contains a quartz overflow tank, manufactured by PCT Inc., max. power of 640 watts and frequency of 750 KHz), all wafers contained more 50,000 particles on each wafer. The laser surface scanner had a range of detection between 0.1 μm and 10 μm (supplied by Particle Measuring Systems, Inc.). The wafers then were subjected to mega sonic cleaning (cleaning conditions: power 640 watts, temp of 45° C., time of 10 min.; spinning dry conditions: time of 20 sec., speed of 3,000 rpm)., and the particle counts retaken. The results reported in Table 5 represent all surface defects without regard to the nature and type of defect. The results reported in Tables 6 represent only the particles of interest having a particle size of >0.2 μm.

TABLE 5

All Surface Defects

| Particles | Before* | $1^{st}$ Clean | $2^{nd}$ Clean | $3^{rd}$ Clean | $4^{th}$ Clean |
|---|---|---|---|---|---|
| $Al_2O_3$ | 3551 | 44637 | 46915 | 46923 | 46923 |
| $SiO_2$ | 4145 | 46319 | 46175 | 46092 | 42343 |
| Diamond | 5002 | 39392 | 27360 | 20711 | 18353 |

*Before any slurry contact.

TABLE 6

>0.2μ Particles

| Particles | Before* | $1^{st}$ Clean | $2^{nd}$ Clean | $3^{rd}$ Clean | $4^{th}$ Clean |
|---|---|---|---|---|---|
| $Al_2O_3$ | 38 | 43127 | 46866 | 46800 | 40571 |
| $SiO_2$ | 202 | 46264 | 46103 | 45788 | 39889 |
| Diamond | 109 | 8833 | 1882 | 1245 | 1275 |

*Before any slurry contact

As shown in Tables 5 and 6, using a standardized cleaning protocol, diamond particles are much easier to remove from the wafer surface and to potentially cause less defects and reduced pCMP cost. This is again believed to be attributable to the hydrophobic nature of the diamond particles which results in a much weaker interaction between the particles and the wafer surface.

What is claimed is:

1. In a chemical-mechanical planarization (CMP) method of a semiconductor wafer employing aqueous or non-aqueous chemical slurries containing abrasive grit, the improvement which comprises:

employing as said grit between about 0.001 and 5 wt-% diamond particles having an average particle size not above about 0.4μ in said slurries.

2. The improved CMP method of claim 1, wherein said diamond particles are polycrystalline diamond particles.

3. The improved CMP method of claim 1, wherein between about 0.01 wt-% and 0.5 wt-% of said diamond particles are employed.

4. The improved CMP method of claim 2, wherein between about 0.01 wt-% and 0.5 wt-% of said diamond particles are employed.

5. A multistage process for the chemical-mechanical planarization (CMP) of a semiconductor wafer, which comprises the steps of:
   (a) forming a primary aqueous slurry from:
      (i) between about 0 and 5 wt-% of an oxidizer,
      (ii) between about 0 and 7 wt-% of a chelating agent,
      (iii) between about 0 and 5 wt-% of a surfactant,
      (iv) between about 0.001 and 5 wt-% diamond particles having an average particle size not above about 0.4μ, and
      (v) an amount of a pH adjustment agent so that the aqueous slurry has a pH of between about 3 and 10,
   (b) subjecting a semiconductor wafer to CMP using said primary aqueous slurry;
   (c) subjecting said semiconductor wafer from step (b) to a cleaning operation;
   (d) forming a secondary aqueous slurry from:
      (i) between about 0 and 5 wt-% of hydroxyl amine,
      (ii) between about 0 and 7 wt-% of a chelating agent,
      (iii) between about 0 and 5 wt-% of a surfactant,
      (iv) between about 0.001 and 5 wt-% diamond particles having an average particle size not above about 0.4μ, and
      (v) an amount of a pH adjustment agent so that the aqueous slurry has a pH of between about 3 and 10.
   (e) subjecting a semiconductor wafer to CMP using said secondary aqueous slurry; and
   (f) subjecting said semiconductor wafer from step (e) to a cleaning operation.

6. The method of claim 5, wherein said primary aqueous slurry and said secondary aqueous slurry contains from about 0.01 to 0.5 wt-% of said diamond particles.

7. The method of claim 6, wherein said primary aqueous slurry and said secondary aqueous slurry contains from about 0.01 to 0.1 wt-% of said diamond particles.

8. The method of claim 5, wherein said chelating agent is one or more of a diamine, a triamine, an alkyl or aryl dicarboxylic acid, or an amino acid.

9. The method of claim 5, wherein said surfactant is one or more of an alkylated polyethylene oxide, an alkylated cellulose, an alkylated polyvinyl alcohol, or an alkyl or aryl carboxylic acid, sulfate, or ammonium salt.

10. The method of claim 5, wherein said diamond particles comprise polycrystalline diamond particles.

11. The method of claim 5, wherein said pH adjustment agent is an acid selected from one or more of a mineral acids and an organic acids; or a base selected from an alkali or alkaline earth metal hydroxides and oxides, ammonia, or an organic amine.

12. A system of aqueous slurries for use in the chemical-mechanical planarization (CMP) of a semiconductor wafer wherein the wafer is subjected to CMP with a primary aqueous slurry, cleaned, subjected to a CMP with a secondary aqueous slurry, and cleaned again,
   (I) said primary aqueous slurry comprising:

(i) between about 0 and 5 wt-% of an oxidizer,
(ii) between about 1 and 5 wt-% of a chelating agent,
(iii) between about 0.1 and 1 wt-% of a surfactant,
(iv) between about 0.025 and 0.5 wt-% diamond particles having an average particle size not above about 0.4µ, and
(v) an amount of a pH adjustment agent so that the aqueous slurry has a pH of between about 4 and 10, (II) said secondary aqueous slurry comprising:
(i) between about 0 and 3 wt-% of an a hydroxyl amine compound,
(ii) between about 0 and 5 wt-% of a chelating agent,
(iii) between about 0.1 and 1 wt-% of a surfactant,
(iv) between about 0.025 and 0.5 wt-% diamond particles having an average particle size not above about 0.4µ, and
(v) an amount of a pH adjustment agent so that the aqueous slurry has a pH of between about 4 and 10.

13. The system of claim 12, wherein said slurry contains from about 0.01 to 0.5 wt-% of said diamond particles.

14. The system of claim 13, wherein said slurry contains from about 0.01 to 0.1 wt-% of said diamond particles.

15. The system of claim 12, wherein said chelating agent is one or more of a diamine, a triamine, an alkyl or aryl dicarboxylic acid, or an amino acid.

16. The system of claim 12, wherein said surfactant is one or more of an alkylated polyethylene oxide, an alkylated cellulose, an alkylated polyvinyl alcohol, or an alkyl or aryl carboxylic acid, sulfate, or ammonium salt.

17. The system of claim 12, wherein said diamond particles comprise polycrystalline diamond particles.

18. The system of claim 12, wherein said pH adjustment agent is an acid selected from one or more of a mineral acids and an organic acids; or a base selected from an alkali or alkaline earth metal hydroxides and oxides, ammonia, or an organic amine.

* * * * *